United States Patent
Bedin et al.

(10) Patent No.: US 11,542,957 B2
(45) Date of Patent: Jan. 3, 2023

(54) FLUID CIRCULATOR WITH HEAT SINK OR DISSIPATOR

(71) Applicant: Taco Italia S.r.l., Sandrigo (IT)

(72) Inventors: Dario Bedin, Marostica (IT); Cristian Muraro, Monticello Conte Otto (IT)

(73) Assignee: Taco Italia S.r.l., Sandrigo (IT)

( * ) Notice: Subject to any disclaimer, the term of this patent is extended or adjusted under 35 U.S.C. 154(b) by 3 days.

(21) Appl. No.: 16/016,184

(22) Filed: Jun. 22, 2018

(65) Prior Publication Data

US 2018/0372118 A1 Dec. 27, 2018

(30) Foreign Application Priority Data

Jun. 22, 2017 (IT) .......................... 102017000069793

(51) Int. Cl.
*F04D 29/58* (2006.01)
*F04D 13/06* (2006.01)
(Continued)

(52) U.S. Cl.
CPC ..... *F04D 29/5813* (2013.01); *F04D 13/0606* (2013.01); *F04D 13/0686* (2013.01);
(Continued)

(58) Field of Classification Search
CPC ............. F04D 13/0606; F04D 13/0686; F04D 29/426; F04D 29/5806; F04D 29/5813;
(Continued)

(56) References Cited

U.S. PATENT DOCUMENTS 5,430,611 A * 7/1995 Patel ..................... H01L 23/433
257/724
8,598,753 B2 * 12/2013 Staehr .................... H02K 11/33
310/71
(Continued)

FOREIGN PATENT DOCUMENTS

DE 10313273 A1 10/2004
DE 10313273 B4 7/2016
(Continued)

OTHER PUBLICATIONS

Frank J. Bartos, AC Drives Stay Vital for the 21st Century, Control Engineering Magazines and Newsletters; https://www.controleng.com/articles/ac-drives-stay-vital-for-the-21st-century/
(Continued)

*Primary Examiner* — Alexander B Comley
(74) *Attorney, Agent, or Firm* — Sutton Magidoff Barkume LLP

(57) ABSTRACT

A fluid circulator including a pump body with an impeller; an electric motor having a rotor connected to the impeller for rotatably driving the impeller; an end portion associated with the motor body for housing at least one electronic board for controlling the circulator. The end portion is monolithically cup-shaped lid fitted onto the motor body in substantial continuity therewith enclosing a housing compartment for said electronic board; an electronic power device mounted onto the electronic board so as to face the end wall of the cup-shaped lid; at least one portion of said end wall being recessed towards the electronic board and being externally provided with at least one cooling fin extending in parallel to the axis of the motor to constitute a heat sink; and a layer of a heat-conductive paste material in contact with the electronic power devices and recessed surface.

18 Claims, 5 Drawing Sheets

(51) Int. Cl.
*H05K 7/20* (2006.01)
*H02K 11/33* (2016.01)
*F04D 29/42* (2006.01)
*H02K 5/22* (2006.01)
*H02K 9/00* (2006.01)
*H02K 29/00* (2006.01)

(52) U.S. Cl.
CPC ......... *F04D 29/426* (2013.01); *F04D 29/588* (2013.01); *F04D 29/5893* (2013.01); *H02K 5/225* (2013.01); *H02K 9/00* (2013.01); *H02K 11/33* (2016.01); *H05K 7/209* (2013.01); *H02K 29/00* (2013.01)

(58) Field of Classification Search
CPC ... F04D 29/588; F04D 29/5893; H05K 7/209; F04B 53/08; F04C 29/047; H02K 5/225; H02K 9/00; H02K 11/33; H02K 29/00
USPC .................. 417/423.1, 423.7, 423.8, 423.14
See application file for complete search history.

(56) References Cited

U.S. PATENT DOCUMENTS

| | | | |
|---|---|---|---|
| 8,721,306 | B2 | 5/2014 | Andersen et al. |
| 10,047,751 | B2 | 8/2018 | Hoj |
| 2006/0267431 | A1 | 11/2006 | Wayne et al. |
| 2010/0301690 | A1 | 12/2010 | DeFlippis |
| 2013/0189134 | A1* | 7/2013 | Irie ................... F04D 13/06 417/423.7 |
| 2014/0030121 | A1 | 1/2014 | Richer et al. |
| 2014/0030124 | A1* | 1/2014 | Hoj ................ F04D 29/426 417/423.7 |
| 2015/0354575 | A1 | 12/2015 | Olsen et al. |

FOREIGN PATENT DOCUMENTS

| | | | |
|---|---|---|---|
| EP | 1582751 B1 | | 10/2005 |
| EP | 1701431 A1 | | 9/2006 |
| EP | 1582751 B1 | | 8/2007 |
| EP | 1947347 B1 | | 7/2008 |
| EP | 2166230 A1 | | 3/2010 |
| EP | 1947347 B1 | | 4/2011 |
| EP | 2 500 575 A1 | | 9/2012 |
| EP | 2500577 B1 | | 6/2016 |
| JP | H10 311290 A | | 11/1998 |
| JP | 2005 337095 A | | 12/2005 |
| JP | 2011032982 | * | 2/2011 |
| JP | 2012 110177 A | | 6/2012 |
| JP | 2015053329 A | | 3/2015 |
| JP | 2015053829 A | | 3/2015 |
| WO | 2014102066 A2 | | 7/2014 |
| WO | WO2014102066 A2 | | 7/2014 |

OTHER PUBLICATIONS

Notice of Opposition to a European patent No. EP3418580; Opponent Grundfos Holding a/s (Denmark); Proprietor of the patent Taco Italia S.r.l.; Date of mention of grants in European bulletin (Art. 97(3), Art. 99(1) EPC); Jan. 28, 2020; Opponent's or representative's reference GS0578EP; Notice of Opposition (pp. 1-19).
Frank J. Bartos, AC Drives Stay Vital for the 21st Century, Control Engineering, Sep. 1, 2004, Internet Publication.
Notice of Opposition, against EP Patent No. 3418580, Dated Oct. 23, 2020.
EP 2166230 Grundfos Management A/S, U.S. Pat. No. 8,598,753 B2 Date of Patent Dec. 3, 2013.
EP 1701431 Grundfos Management A/S, EP 1701431 (A1)—Sep. 13, 2006.
WO 2014102066 Grundfos Holding A/S, Pub. No. US2015/0354575 A1 Pub. Date Dec. 10, 2015.
DE 10313273 ebm-papst Mulfingen GmbH & Co., DE 10313273 (A1)—Oct. 7, 2004.
JP 2015053829 Hitachi Automotive Systems Ltd, Pub. No. 2015-053829A Japan Pub Date Mar. 19, 2015.
EP 1582751 Grundfos A/S, EP 1582751 (A1)—Oct. 5, 2005.
EP 1947347 Grundfos Management A/S, U.S. Pat. No. 8,721,306 B2 Date of Patent May 13, 2014.
EP 2500577 Grundfos Management a/s, U.S. Pat. No. 10,047,751 B2 Date of Patent Aug. 14, 2018.

* cited by examiner

SECTION E-E

FLUID CIRCULATOR WITH HEAT SINK OR DISSIPATOR

TECHNICAL FIELD

The present invention relates to a fluid circulator, in particular a fluid circulator for heating or cooling systems, comprising a heat sink or dissipator.

In general, the present invention is applied in the field of the pumps for movement of fluids, in which an impeller is coupled and made to move by an electric motor.

PRIOR ART

Centrifugal motor-driven pumps, generally known under the name of "circulators", are employed for the circulation of carrier fluid in the context of heating and cooling systems.

As it is known, a circulator generally comprises a synchronous electric motor, whose rotor is keyed on a shaft coupled to an impeller of a pump, which appears therefore operated by the electric motor itself and which provides head to the fluid. Known circulators can have different configurations for the impeller, based on the processed fluid and the head to be provided. For example, a known configuration provides an impeller with curved blades, of the centrifugal type, but other configurations of impeller blades can be employed.

Circulators are often used in heating and/or cooling systems, constituting functional elements thereof.

Circulators are known, in which an electronic control unit adjusts the motor operation by adjusting the application of tension or current on the stator windings.

Circulators are also known, in which the task of determining flow rate and pressure of the moved fluid is referred to the electronic control unit.

These electronic control units are normally housed in an end portion of the circulator, normally arranged axially to the motor on the opposite side with respect to the impeller.

Depending on the version of the circulator the control units can be housed in a watertight portion of the case, called terminal box, or, more simply, they are protected by a cup-shaped lid which is overlapped and jointed with the motor body of the circulator.

In both these different situations it is suitable to equip the control unit with a heat sink which can aid the dissipation of the heat generated by the electronic circuit, this in view of the fact that the circulator can move fluid at a relatively high temperature and it is therefore in turn a heated element.

The known art already suggests some solutions to realize the heat sink at the back of the electronic control unit.

For example, a circulator of the known type is described in the European patent of Grundfos No. EP 10 582 751 B1 which describes a pump with stator and terminal box equipped with a heat sink. A conformation is provided, in which the dissipator is central and the terminal box occupies a peripheral annular portion surrounding the dissipator.

Thereby heat produced on the stator can also be dissipated but the terminal box takes advantage only in a small percentage of the dissipation capacity.

Another known solution is described in the U.S. Pat. No. 8,598,753 B2 which concerns a circulator having a motor body associated with a terminal portion which protects an electronic board. The external wall of that terminal box is formed with a thermo-conductive plastic material. This terminal box is however laterally extended with a portion which extends to cover other laterally-protruding electronic circuitry, probably to increase the thermal dissipation surface.

Although advantageous under various aspects, this solution involves the whole external surface of the terminal box and it requires the usage of expensive special plastics.

The technical problem underlying the present invention is to devise a circulator equipped with a heat sink having such structural and functional features as to allow the heat generated by the electronic control board during the normal operation of the circulator to be efficiently dissipated remedying all the drawbacks of the solutions suggested by the prior art.

Another aim of the present invention is to make available a circulator provided with a heat sink realized in the same protection lid of the electronic control board.

A further aim of the present invention is to present a circulator provided with a heat sink which has a simple and economical structure and which can be produced on a massive scale.

A further particular aim of the present invention is to avoid the usage of special materials with intrinsic features of being excellent heat conductors.

SUMMARY OF THE INVENTION

The solution idea underlying the present invention is to realize the heat sink in the structure itself of the cover or protection lid of the electronic board by forming that lid integrally with a plastic synthetic material capable to be realized by moulding and provided with cooling fins which concern only one lid portion while keeping the overall encumbrance, or size or dimensions, thereof within the lateral extents of the motor body.

A first embodiment of the present invention relates to a fluid circulator comprising:

a pump body comprising an impeller for the movement of said fluid;

a motor body comprising an electric motor for putting said impeller into rotation around a rotation axis;

an end portion of the circulator associated with said motor body for the containment of at least one electronic board for the control of said circulator;

said end portion being a cup-shaped lid adapted to be fitted on the motor body in substantial continuity therewith to enclose a housing vane or compartment for said electronic board;

electronic power devices mounted onto said board facing the bottom wall of said cup-like lid;

at least one portion of said bottom wall being lowered towards said electronic board and externally provided with some cooling flaps or fins extended in parallel to said axis to form a heat sink or dissipator;

a layer of a good heat conductive material being provided in contact between at least some of said electronic power devices and the lowered portion of said bottom wall;

the lowered portion of said bottom wall not exceeding half portion of said bottom wall.

Advantageously, the above-said lid is realized integrally with a plastic synthetic material which is capable to be processed by moulding, for example a resin capable of injection moulding.

The lid has a lateral wall defining an open mouth fitted onto the motor body with a peripheral edge jointed to the motor body itself so as to be a finish and protection element of the electronic control board which appears therefore housed in the compartment formed in the gap between the lid bottom wall and the motor body.

Moreover, the above-said lid has dimensional encumbrances (or sizes) which do not provide projections protruding beyond the dimensions of the motor body; the cooling fins appear thereby incorporated in the lid structure conformation and they do not increase the lateral dimensions thereof.

A further embodiment of the present invention relates to a fluid circulator with a motor-driven pump, intended for the movement of fluid particularly in heating and/or cooling systems comprising:

a pump body comprising an impeller for the movement of said fluid;

a motor body comprising an electric motor for putting said impeller into rotation around a rotation axis;

an end cover for said motor body for the containment of at least one electronic board of said circulator; said end cover being shaped as a cup-like lid adapted to be fitted on the motor body to enclose a housing vane or compartment for said electronic board;

electronic power devices mounted onto said board facing a closing wall of said cup-like lid;

at least one portion of said closure wall being lowered towards said electronic board and externally provided with some cooling flaps or fins extended in parallel to said rotation axis to form a heat sink or dissipator;

the lowered portion of said closure wall not exceeding half portion of said closure wall at a periphery of said closure wall.

It should be noted that a layer of a good heat conductive material is provided in contact between at least some of said electronic power devices and the lowered portion of said closure wall.

The motor of the fluid circulator is preferably a synchronous motor.

Moreover, said cup-like lid has lateral walls defining an open mouth fitted onto the motor body with a peripheral edge matching with the motor body so as to be a finishing and protection element of the electronic control board which is housed in the vane formed in the gap between the bottom wall of the lid and the motor body.

Advantageously the fins of the heat sink are extended from said lowered portion of the closure wall up to the same level of the remaining portion of the closure wall of the lid.

So, the cup-like lid has dimensional encumbrances or sizes corresponding substantially to the dimensional encumbrances of the motor body.

Further features and advantages will be more apparent from the following detailed description of a preferred non-limiting embodiment of the present invention, and from the dependent claims which outline preferred and particularly advantageous embodiments of the invention.

BRIEF DESCRIPTION OF THE DRAWINGS

The invention is illustrated with reference to the following figures, given by way of non-limiting example, in which.

In the different figures, like elements will be identified by like reference numbers.

DETAILED DESCRIPTION

Figure 1:
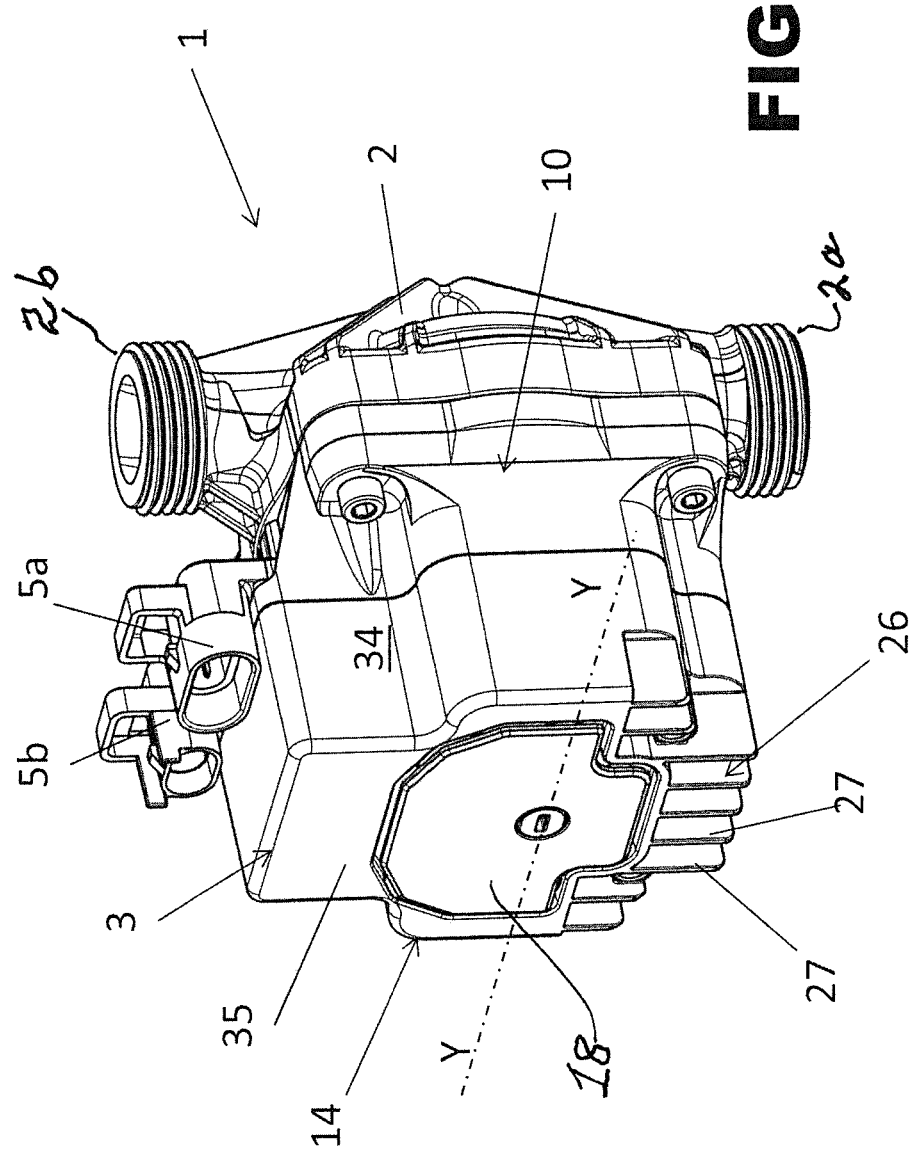
FIG. 1 shows a perspective view of a circulator according to the present invention.

The example of FIG. 1 schematically represents a fluid circulator 1 realized according to the present invention. The circulator 1 can also be defined as a motor-driven pump, intended for the movement of fluid particularly in heating and/or cooling systems.

In the general configuration thereof, the circulator 1 comprises a motor body 10 and a pump body 2, associated with each other to realize the movement of the fluid.

The motor body 10 comprises therewithin an electric motor 4. The pump body 2 comprises therewithin an impeller 21 made to rotate by the electric motor 4.

The impeller 21 is housed in a containment housing 11, which covers it in the pump body 2 and within which the fluid is moved during the circulator's operation.

The pump body 2 comprises an outlet flange 2a and an inlet flange 2b, for fluid connection to a pipe system, which the circulator 1 is connected to and within which the fluid to be moved flows.

Figure 4:
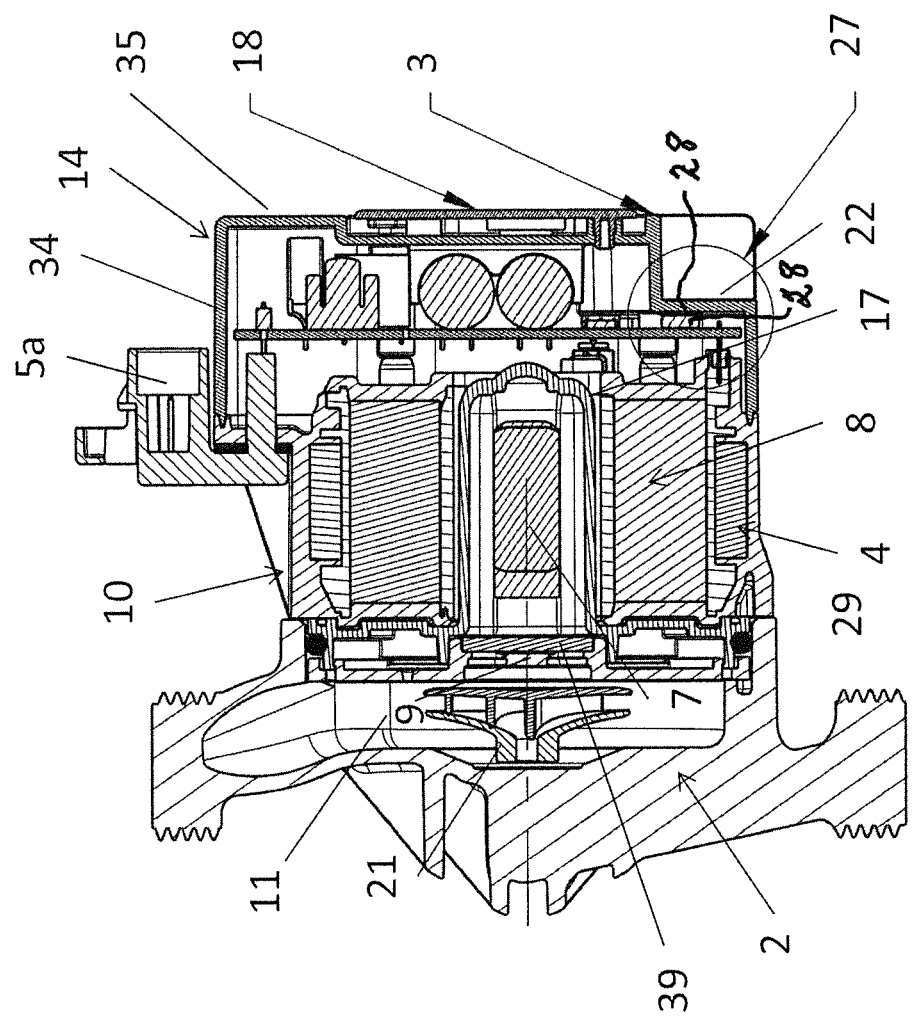
FIG. 4 shows an axial and longitudinal cross-sectional view of an alternative embodiment of circulator according to the invention but with a closed sleeve.
Figure 5:
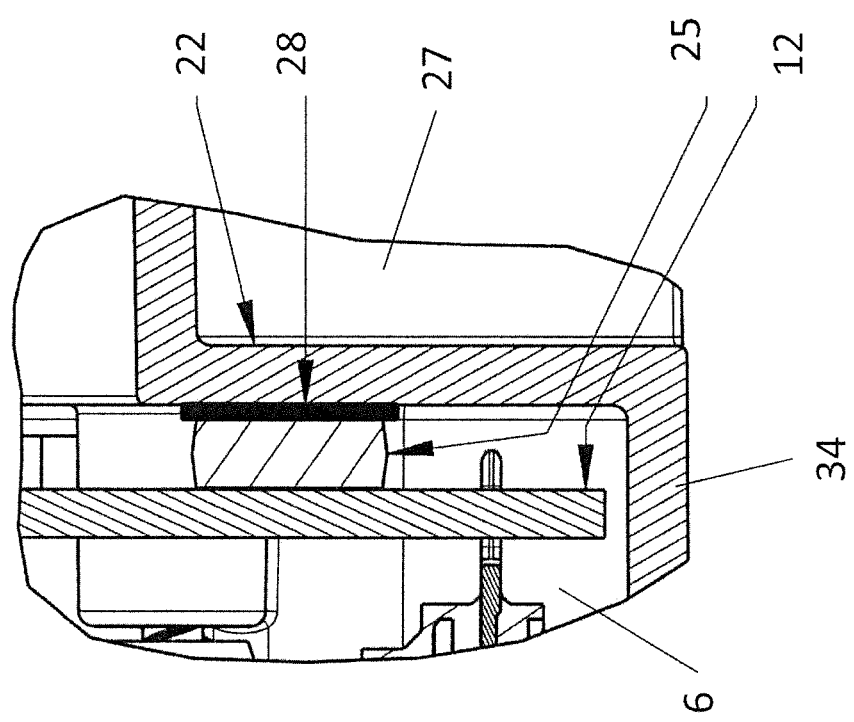
FIG. 5 shows a partial cross-sectional view of a detail of the circulator according to the invention.

FIG. 4 shows, in an axial and longitudinal sectional view, the main internal components of the circulator 1.

As already mentioned, the motor body 10 houses therewithin an electric motor 4, preferably of the synchronous type. The electric motor 4 is essentially similar in the following components thereof: a permanent-magnet rotor 7 and a stator 8 with the related electric windings. The stator 8 is preferably of the type with four stator arms forming a configuration of two-phase electric motor, but other configurations can also be adopted, for example the single-phase one. The rotor 7 is housed within a protection sleeve 17 formed integrally with a flange which faces a wall of the coil 11 in which the impeller 21 rotates.

The motor body 10 further comprises a shaft 9 of the electric motor, onto which the rotor 7 is keyed and kinematically coupled. The protection sleeve 17 of the rotor 7 has a rear end terminating with a shrinkage, or constriction, 29 within which a support bearing of the motor shaft 9 is housed.

The impeller 21, coupled and made to rotate by the shaft 9, is adapted to impart a thrust or pressure head, to the fluid, being preferably an impeller of the centrifugal type, to provide a head i.e. an increase in pressure thereto.

Figure 2:
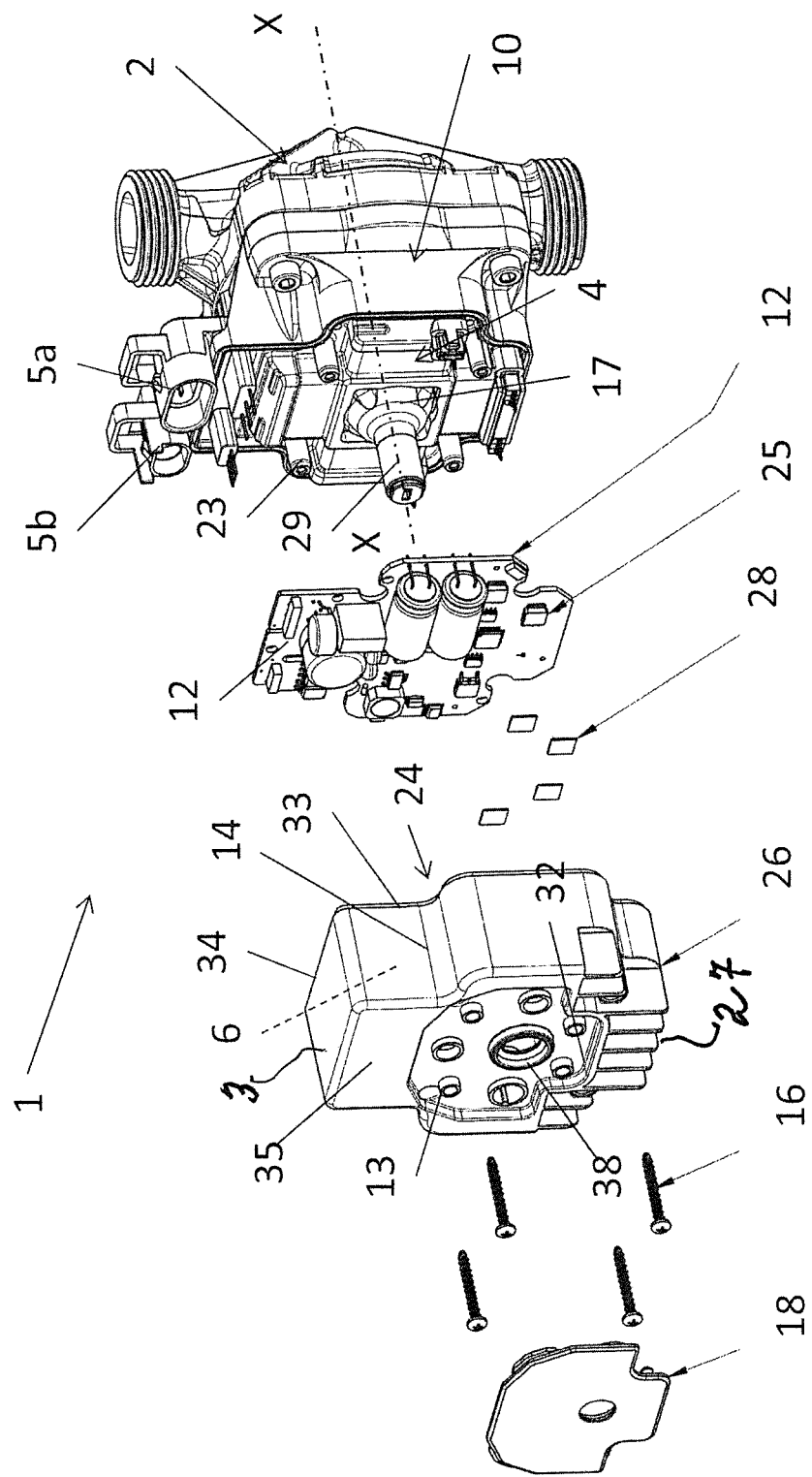
FIG. 2 shows a perspective view of the components of the circulator of FIG. 10, in a partially exploded format, or configuration.

The impeller and the motor shaft rotate around an axis X-X shown in FIG. 2.

The motor shaft 9 passes through the wall which separates the pump body 2 from the motor body 10, preferably through a hole sealed by a suitable gasket surrounding the shaft.

In general, the motor body 10 and the pump body 2 are separated from each other by a plurality of suitable gaskets, so as to realize a waterproof motor body and a watertight coil 11, avoiding fluid, or liquid, to seep into the motor body.

In general, the circulator 1 comprises suitable supports for the rotation of the motor shaft 9, such as for example rolling bearings 29 and thrust bearing elements 39 adapted to support the thrusts occurring during the fluid circulation in the circulator.

The circulator 1 further comprises an end portion 3 associated with the motor body 10. That end portion 3 is preferably positioned opposite to the pump body 2.

The end portion 3 comprises a closure and protection lid 14 for an electronic control board 12 of the circulator 1. The electronic control board 12 is housed in a containment vane or compartment 6 defined and delimited by the lid 14 when it is fitted and mounted onto the motor body 10.

The lid 14 is constrained to the motor body 10 by fixing screws 16 inserted in corresponding peripheral holes 13 of the lid 14 and housed in corresponding seats 23 provided in the motor body 10.

The electronic board 12 is responsible for the control of the operation of the circulator 1, in particular for the control of the power supply of the electric motor 4.

The circulator 1 further comprises a plurality of connectors 5a and 5b of the electric or electronic type, which are connected to the electronic board 12 contained by the end portion 3.

In general, the end portion 3 houses therewithin besides the electronic board 12 also a plurality of electric and electronic power devices 25 for the power supply and control of the electric motor, for example semiconductor components of the IGBT type. It is those devices 25 which produce most of the heat to be dissipated.

Advantageously, according to the invention, a heat sink or dissipator 26 is associated with the electronic board 12, which is adapted to dissipate to the environment, in which the circulator is installed, most of the heat generated by the components of the electronic board 12, and in particular the power devices 25.

More particularly, the heat sink 26 is structured in the closure lid 14 itself of the vane or compartment 6.

The heat sink 26 is visible and identifiable from outside the end portion 3, since it comprises a plurality of cooling fins 27 which comprise at least one portion of the lid 14.

More specifically, the end portion 3 of the circulator associated with said motor body 10 is structured as a cup-shaped lid adapted to be fitted on the motor body in substantial continuity therewith to enclose a housing vane 6 or compartment for said electronic board 12.

At least some of the electronic power devices mounted onto said board 12 are facing the bottom wall 35 or closure wall of said cup-like lid 14.

Advantageously, at least one portion 22 of said bottom wall 35 is lowered, or formed inwardly, towards said electronic board 12 and externally provided with the cooling flaps or fins 27 extending in parallel to said motor axis X-X to form the heat sink 26 or dissipator.

A layer 28 of a good heat conductive material is provided in contact between at least some of said electronic power devices 25 and the lowered portion 22 of said bottom wall 35. The lowered portion of said bottom wall does not exceed half portion of said bottom wall 35.

Therefore, the heat sink 26 is realized in the structure itself of the cover or protection lid 14 of the electronic board 12 and it is formed integrally with the lid 14 with a plastic synthetic material capable to be realized by moulding. However, that plastic material is not necessarily a material having special features of good heat conductivity.

Preferably, the lid 14 is monolithically realized by moulding a plastic resin, in particular by injection moulding.

The capacity to dissipate the heat is due namely exclusively to the conformation of the dissipator integrally formed in the lid 14.

The heat sink 26 is equipped with cooling fins or flaps 27 which concern at least one part of the encumbrance thereof. Those fins 27 are extended in parallel to each other and in parallel to the axis X-X of the motor shaft 9.

The cooling fins 27 are formed on at least one portion of the lid 14, for example in a half-part 32.

Figure 3:
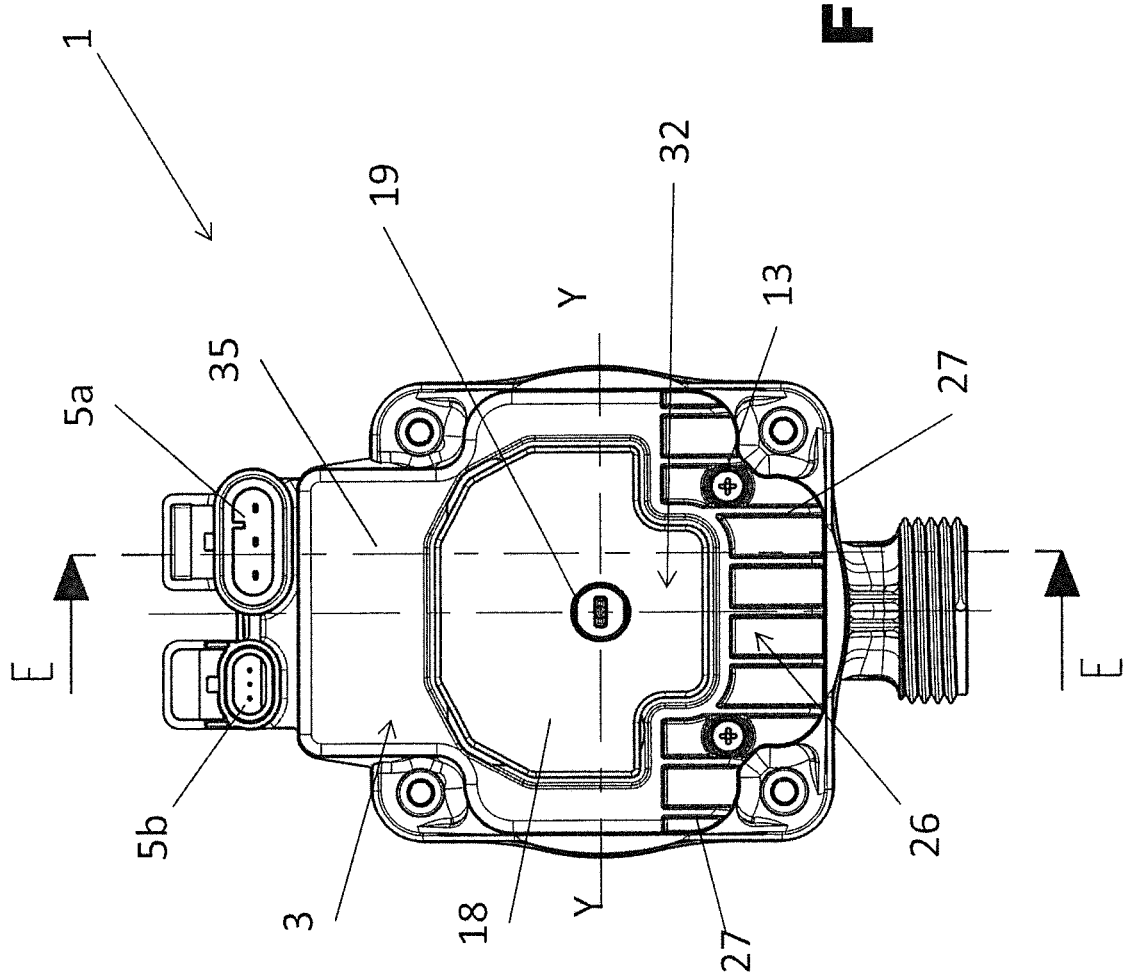
FIG. 3 shows a front view of the circulator of FIG. 10.

Referring to FIG. 3, a middle axis of the circulator 1 extended transversely to the axis X-X of the motor shaft 9 is indicated with Y-Y. That middle axis defines two half-spaces which will be called upper and lower without this representing a limitation from the point of view of the possibilities of installation of the circulator 1.

The half-part 32 of the circulator 1 concerned by the presence of the dissipator 26 is the lower half-part while the connectors 5a and 5b of the electric or electronic type are positioned in the upper part, namely on the opposite side to the dissipator with respect to the middle axis Y-Y.

Advantageously, the lower half-part 32 of the lid 14, comprising the cooling fins 27, has a lowered surface 22 from which the fins 27 extend.

The end portion 3 which protects and encloses the electronic board 12, as well as the other electric and electronic devices 25 intended to power and control the electric motor, such as IGBTs, capacitors, switches, circuits, etc., is also defined as end box or "terminal box", since it closes or completes the structure of the circulator 1. In particular, that terminal portion 3 represents a finish end of the circulator 1, associated with the motor body 10.

The electronic board 12 is electrically connected to the connectors 5a, 5b already described. Preferably, the electronic board 12 is further associated with the heat sink 26 configured to keep the temperature of the electronic board 12 below a certain threshold, during the circulator's operation.

FIG. 2 shows a perspective view of the circulator 1, in an exploded or disassembled configuration. In FIG. 2, the motor body 10 and the pump body 2 are kept assembled, whereas the end portion 3 is partly separated therefrom, split into some elements which will be now described.

The end portion 3 comprises the essentially cup-shaped lid 14 with a bottom part 35 and a lateral, or peripheral, wall 34. The lateral wall delimits an open mouth 24 having a peripheral edge 33 fitted onto the motor body 10 and jointed to the motor body itself in substantial continuity.

In the preferred embodiment, the peripheral edge 33 of the open mouth 24 of the lid 14 has a shape coupling with the peripheral edge of the motor body 10, so as to realize a single body for the circulator 1, when assembled.

The end portion 3 also performs the function of a finish and protection element of the electronic control board 12, which appears therefore housed in the compartment 6 formed in the gap between a bottom wall 35 of the lid and the motor body 10.

Moreover, the above-said lid 14 has dimensions which do not provide projections protruding beyond the lateral or peripheral surfaces of the motor body 10; the cooling fins 27 appear thereby incorporated in the structure conformation of the lid 14 and they do not increase the lateral dimensions thereof.

More particularly, said fins 27 are extended from said lowered surface 22 and terminate with the free ends thereof on the level with said bottom wall 35 of the lid 14.

In particular, the peripheral encumbrance of the motor body 10, identified by the lateral surface thereof, corresponds to the peripheral encumbrance of the end portion 3, identified by the lateral surface thereof; that correspondence at least between the coupling surface and the terminal surface causes the lateral walls of the end portion 3 and of the motor body 10 to appear, at least at the above-said coupling, aligned to each other once they are mounted. An alignment without interruption is thereby ensured between the peripheral walls of the elements composing the circulator 1.

The lowered surface 22 of the lid 14 is located close to the electronic board 12 when the lid 14 is mounted onto the motor body 10.

The distance between the electronic board 12 and the lowered surface 22 of the lid 14 is a few millimetres and a layer 28 of paste material having good heat conduction features is interposed between the board 12 and the interior of surface 35 so as to realize a thermal conduction continuity. It is in particular a silicone resin.

More particularly, the electric and electronic power devices 25 mounted on board of the board 12 are located on the side of the board facing the lowered surface 22 of the lid 14.

Precisely the IGBT devices which produce more heat to be dissipated during the normal operation thereof are located at the lower half-part 32 of the circulator in which the lid 14 has the lowered surface 22.

The conductive material layer 28 is provided above these electronic power devices 25, which puts them directly in contact with the lowered surface 22 of the lid 14. Such conductive material layer 28 may be separate pieces in contact with the individual power devices 25 or a single piece extending in contact with each power device 25.

A direct and contact-conduction heat dissipation is thereby obtained between the power devices 25 and the heat sink 26 formed in the half-part 32 of the lid 14 and equipped with the cooling fins 27.

Within the end portion 3, the electronic board 12 is substantially flat and it comprises various electronic components fad and turned outwards of the circulator 1, substantially on the opposite side of the motor body 10.

As clearly visible in FIGS. 2 and 3, the heat sink is realized on the lower half-part 32 of the circulator 1 so as to appear exposed outwards but substantially hidden below the middle plane passing through the middle axis Y-Y.

The end portion 3 also comprises a central hole 38 to house a closure plug 19 to access the bottom of the sleeve 17 by a manoeuvring tool capable to move the rotor in case of lock due to the limestone.

The narrowed end 29 of the sleeve bottom appears to emerge at the mouth of that central hole 38.

A closure and finish plate-like insert 18 is provided to cover that central hole 19 and at least one upper pair of the mouths 13 of the fixing screws 16 of the lid 14 to the motor body 10. That insert is snap-inserted in a corresponding slightly lowered seat formed on the external surface of the wall 35 of the lid 14.

In a preferred embodiment, the hole 38 provides access to a cylindrical housing which defines an internal cavity of the lid 14 in which the rear end 29 of the sleeve 17 is axially extended up to come close to the hole 38.

The plug 19 which covers and stops the hole 18 is provided with a slot for the insertion of a manoeuvring tool which is mounted in the cylindrical housing with interposition of sealing gaskets.

Turning back to the cover insert 18, that insert has a flat shape; in other embodiments it could have different shapes.

That cover insert 18 is configured to be applied onto the end portion 3, particularly in a central position. That cover insert 18 is optional, and it has mainly an aesthetic value. Moreover, the cover insert 18 can be used to support labels or distinctive marks.

That cover insert 18 hides from sight at least one pair of holes 13 of the screws 16, but it carries a central hole for accessing the internal cavity 38 which the plug 19 is housed in; in an alternative, that central hole could be absent, and the plug 19 accessible by simply removing the cover insert 18.

In view of the description quoted here, the person skilled in the art will be allowed to envisage further modifications and alternatives, in order to meet contingent and specific requirements.

The embodiments described here are thus to be intended as illustrative and non-limiting examples of the invention.

The invention claimed is:

1. A fluid circulator with a motor-driven pump, for the movement of a fluid in heating and/or cooling systems, the fluid circulator comprising: a pump body comprising an impeller for the movement of said fluid; a motor body comprising an electric motor for putting said impeller into rotation around a rotation axis; the electric motor being surrounded by a peripherally enclosing motor wall extending axially and having a first end edge axially distant from the pump body and a second end edge adjacent the pump body; the second end edge of the peripherally enclosing motor wall defining an open mouth connected to the pump body; and an end cover for said fluid circulator, said end cover being a cup-shaped lid integrally comprising a peripherally enclosing lid wall extending axially and having a first end edge, the first end edge being axially distal from the motor body, and a second end edge; and a lid end closure wall for said cup-shaped lid; said lid end closure wall being an end closure wall extending transversely to the peripherally enclosing lid wall and axially closing off the first end edge of said peripherally enclosing lid wall, the second end edge of the peripherally enclosing lid wall defining an open mouth connected to the motor body; and, a portion of the peripherally enclosing lid wall and the lid end closure wall and the motor body defining an electronic control compartment; at least one electronic control board housed within the electronic control compartment; at least one electronic power device for controlling said fluid circulator, the at least one electronic power device being supported by the at least one electronic control board towards the lid end closure wall; no portion of the peripherally enclosing lid wall or the lid end closure lid wall extending transversely beyond the peripherally enclosing lid wall surrounding the electronics compartment; and the cup-shaped lid being formed of a plastic synthetic material which is capable of being processed by injection molding; the at least one electronic power device is mounted onto said at least one electronic control board so as to extend toward said lid end closure lid wall; at least one portion of said lid end closure wall being axially recessed to form a recessed portion of the lid end closure wall, towards said at least one electronic power device extending towards said recessed portion of the lid end closure wall, said recessed portion being externally provided with at least one cooling fin extending parallel to said rotation axis to form a heat sink or dissipator; the recessed portion of said lid end closure wall not exceeding half of said lid end closure wall; and a layer of a paste material designed to be a conductor of heat, being located in a contacting relationship between the recessed portion of the lid end closure wall and the at least one electronic power device which produces most of the heat to be dissipated.

2. The fluid circulator according to claim 1, wherein said at least one cooling fin axially extends from said portion of the end closure wall that is axially recessed up to the level of the portion of the end closure wall of the cup-shaped lid that is not axially recessed.

3. The fluid circulator of claim 1, wherein the paste material has a heat conductivity at least equal to that of aluminum alloy.

4. The fluid circulator of claim 1, wherein the paste material is a silicone paste.

5. The fluid circulator according to claim 1, wherein the at least one cooling fin comprises a plurality of fins.

6. A fluid circulator comprising: a pump body comprising an outer peripherally enclosing wall and a rotatable impeller for the movement of a fluid, the impeller being rotatable about the a longitudinal axis of the pump body and of the fluid circulator; a motor body comprising an electric motor, the electric motor comprising a rotor connected to said impeller for putting said impeller into rotation about the longitudinal axis of the pump body and of the fluid circulator and a stator concentrically surrounding the rotor, and a peripherally enclosing motor body wall concentrically surrounding the periphery of the stator and having a first peripherally enclosing end edge connected to the outer peripherally enclosing peripheral wall of the pump body and a second peripherally enclosing end edge axially distal from the pump body; the peripherally enclosing motor body wall extends axially between the first and the second end edges; and a cup-shaped lid comprising a peripherally enclosing lid wall integrally formed with an end lid wall, the peripherally enclosing lid wall extending axially and having a first peripherally enclosing lid end edge and a second peripherally enclosing lid end edge, the peripherally enclosing end lid wall extending axially between the first and second peripherally enclosing lid end edges, and the end lid wall extending transversely to the peripherally enclosing lid wall and closing off the second lid end edge of said peripherally enclosing lid wall, the first lid end edge of the peripherally enclosing lid wall defining an open mouth and being connected to the second end edge of the peripherally enclosing motor body wall; the lateral dimensions of the cup-shaped lid along its entire length are wholly within the lateral dimensions of the peripherally enclosing motor body wall at the second end edge of the peripherally enclosing motor body wall; and at least one electronic board supporting at least one electronic power device designed to operate the electric motor, the at least one electronic board extending transversely to the peripherally enclosing lid wall; a motor control compartment being defined by the portion of the peripherally enclosing lid wall extending distal from the motor body and the end lid wall; and the at least one electronic power device being mounted onto said at least one electronic board and extending into the motor control compartment and towards an opposing recessed portion of the end lid wall of said cup-shaped lid; the cup-shaped lid being formed of a plastic synthetic material which is capable of being processed by injection molding so as to be able to form the cup-shaped lid; the opposing recessed portion of said end lid wall of the cup-shaped lid being recessed axially inward towards said at least one electronic board, the opposing recessed portion being externally provided with at least one cooling fin extending axially parallel to said rotation axis to form a heat sink to dissipate the heat from the at least one electronic power device; and a layer of a paste material designed to conduct heat, provided in contact between the at least one electronic power device and the opposing recessed portion of said end lid wall, the at least one electronic power device producing most of the heat to be dissipated from the motor control compartment; the opposing recessed portion of said end lid wall not exceeding half of said end lid wall.

7. The fluid circulator according to claim 6, wherein said at least one cooling fin extends axially from said portion of the end lid wall that is axially recessed and terminates axially coextensively with the portion of the end lid wall of the lid that is not recessed and does not extend peripherally beyond the peripherally enclosing lid wall of the lid.

8. The fluid circulator according to claim 6, wherein said at least one electronic power device includes IGBT semiconductor components.

9. The fluid circulator according to claim 6, wherein said cup-shaped lid has dimensions in all directions transverse to the rotation axis that are free of protruding projections extending transversely beyond the dimensions of the peripherally enclosing motor body wall transverse to the rotation axis, so that said at least one cooling fin extends axially from the portion of the end lid wall of the cup-shaped lid that is recessed and remains wholly within both of the transverse and axial dimensions of the cup-shaped lid.

10. The fluid circulator according to claim 6, wherein the end lid wall of said cup-shaped lid has a central hole for accessing a rear end of a protection sleeve of the rotor and a covering insert inserted in a depressed seat formed on the external surface of the end lid wall of the lid.

11. The fluid circulator according to claim 6, wherein said paste material is a heat conductive silicone paste.

12. The fluid circulator according to claim 6, further comprising electrical connectors connected to the at least one electronic board, wherein with respect to a middle axis Y-Y of the circulator said heat sink is located on an opposite side with respect to the electrical connectors.

13. The fluid circulator according to claim 6, wherein said electric motor is a synchronous motor.

14. The fluid circulator according to claim 6, wherein the at least one cooling fin comprises a plurality of fins.

15. The fluid circulator in accordance with claim 6, wherein the cup-shaped lid is integrally formed by injection moulding of H the plastic synthetic material.

16. The fluid circulator in accordance with claim 15, wherein the cup-shaped lid has a central opening through the end lid wall.

17. A The fluid circulator in accordance with claim 15, wherein the peripherally enclosing lid wall of the cup-shaped lid extends below the at least one electronic board to where the cup-shaped lid connects to the second end edge of the peripheral motor body wall.

18. The fluid circulator in accordance with claim 6, further comprising: a laterally extending motor wall sealably connected to the motor body so as to close off the rotor and stator from the motor control compartment, the laterally extending motor wall having a central opening facing an end of the rotor distal from the impeller, so as to permit manual manipulation of the rotor in the event of a stoppage of the rotor; and a closure plug for the central opening of the laterally extending motor wall.

* * * * *